United States Patent
Zhang et al.

(10) Patent No.: US 11,714,026 B2
(45) Date of Patent: Aug. 1, 2023

(54) VIBRATION DETECTION APPARATUS APPLIED TO NUCLEAR MAGNETIC RESONANCE WHILE DRILLING INSTRUMENT

(71) Applicants: CHINA OILFIELD SERVICES LIMITED, Tianjin (CN); CHINA NATIONAL OFFSHORE OIL CORPORATION, Beijing (CN)

(72) Inventors: Jiawei Zhang, Hebei (CN); Fang Sai, Hebei (CN); Zhibo Xue, Hebei (CN); Guangwei Wang, Hebei (CN); Yu Cheng, Hebei (CN); Xiangxin Chen, Hebei (CN); Jingzhi Chen, Hebei (CN)

(73) Assignees: CHNA OILFIELD SERVICES LIMITED, Tianjin (CN); CHINA NATIONAL OFFSHORE OIL CORPORATION, Beijing (CN)

( * ) Notice: Subject to any disclaimer, the term of this patent is extended or adjusted under 35 U.S.C. 154(b) by 64 days.

(21) Appl. No.: 17/608,768

(22) PCT Filed: Feb. 25, 2020

(86) PCT No.: PCT/CN2020/076634
§ 371 (c)(1),
(2) Date: Nov. 4, 2021

(87) PCT Pub. No.: WO2020/228391
PCT Pub. Date: Nov. 19, 2020

(65) Prior Publication Data
US 2022/0299399 A1  Sep. 22, 2022

(30) Foreign Application Priority Data
May 10, 2019 (CN) .......................... 201910389357.6

(51) Int. Cl.
| | | |
|---|---|---|
| G01M 7/02 | (2006.01) | |
| G01R 33/34 | (2006.01) | |
| G01V 3/32 | (2006.01) | |

(52) U.S. Cl.
CPC ............. *G01M 7/025* (2013.01); *G01R 33/34* (2013.01); *G01V 3/32* (2013.01)

(58) Field of Classification Search
CPC .......... G01V 3/32; G01R 33/34; G01M 7/025
See application file for complete search history.

(56) References Cited

U.S. PATENT DOCUMENTS

| | | | |
|---|---|---|---|
| 5,984,023 A | 11/1999 | Sharma et al. | |
| 6,179,066 B1 * | 1/2001 | Nasr | ................... E21B 17/1014 |
| | | | 175/45 |

(Continued)

FOREIGN PATENT DOCUMENTS

| | | |
|---|---|---|
| CN | 204082127 U | 1/2015 |
| CN | 104374652 A | 2/2015 |

(Continued)

OTHER PUBLICATIONS

Decision of Grant for Russian Patent Application No. 2021133333/28, dated Aug. 17, 2022, 16 Pages (including English Translation).

(Continued)

*Primary Examiner* — Gregory H Curran
(74) *Attorney, Agent, or Firm* — Brooks Kushman P.C.

(57) ABSTRACT

A vibration detection apparatus applied to a nuclear magnetic resonance while drilling instrument, including a vibration table. The vibration table is configured to horizontally clamp the nuclear magnetic resonance while drilling instrument and further includes a graduated barrel that contains a detection liquid; the graduated barrel is configured to be suspended at the upper side of the vibration table and be spaced apart from the nuclear magnetic resonance while (Continued)

drilling instrument; when the vibration table performs vibration, the graduated barrel keeps stationary, and the nuclear magnetic resonance while drilling instrument preforms high-pressure emission and measurement by means of the graduated barrel. Therefore, the nuclear magnetic resonance while drilling instrument can obtain the echo signal of the graduated barrel during vibration, thereby more accurately detecting the performance thereof and shortening a detection time length.

17 Claims, 5 Drawing Sheets

(56) References Cited

U.S. PATENT DOCUMENTS

| | | | |
|---|---|---|---|
| 9,945,975 B2* | 4/2018 | Song | G01V 1/48 |
| 10,281,356 B2* | 5/2019 | Matsumoto | G01M 7/06 |
| 2002/0075000 A1 | 6/2002 | Prammer et al. | |
| 2005/0088176 A1 | 4/2005 | Kruspe et al. | |
| 2005/0155415 A1 | 7/2005 | Kurowski et al. | |
| 2010/0116550 A1 | 5/2010 | Hutin et al. | |
| 2013/0034101 A1 | 2/2013 | Cathey et al. | |
| 2013/0341012 A1 | 12/2013 | Belani et al. | |

FOREIGN PATENT DOCUMENTS

| | | |
|---|---|---|
| CN | 204556209 U | 8/2015 |
| CN | 204782978 U | 11/2015 |
| CN | 105298486 A | 2/2016 |
| CN | 207979681 U | 10/2018 |
| CN | 108918570 A | 11/2018 |
| CN | 110031172 A | 7/2019 |
| CN | 209689866 U | 11/2019 |
| RU | 2413841 C2 | 3/2011 |
| RU | 2548636 C2 | 4/2015 |
| WO | 2016022129 A1 | 2/2016 |

OTHER PUBLICATIONS

International Search Report for Application No. PCT/CN2020/076634, dated May 22, 2020, 5 Pages (including English Translation).

-irst Office Action and Search Report for Chinese Application No. 201910389357.6, dated Mar. 5, 2020,17 Pages including English Translation).

Second Office Action for Chinese Application No. 201910389357.6, dated Aug. 14, 2020, 14 Pages (including English Translation).

Third Office Action for Chinese Application No. 201910389357.6, dated Nov. 23, 2020, 11 Pages (including English Translation).

* cited by examiner

VIBRATION DETECTION APPARATUS APPLIED TO NUCLEAR MAGNETIC RESONANCE WHILE DRILLING INSTRUMENT

CROSS-REFERENCE TO RELATED APPLICATIONS

This application is the U.S. national phase of PCT Application No. PCT/CN2020/076634 filed on Feb. 25, 2020, which claims priority to Chinese Patent Application No. 201910389357.6 filed on May 10, 2019, both of which are incorporated herein by reference in their entireties.

TECHNICAL FIELD

The disclosure relates to but is not limited to the field of petroleum drilling, in particular to a vibration detection apparatus applied to a while-drilling nuclear magnetic instrument.

BACKGROUND

At present, in order to test performance of an instrument, a vibration test of an existing while-drilling nuclear magnetic instrument needs to be carried out on a vibration table. However, in the current test process, the while-drilling nuclear magnetic instrument cannot perform echo signal measurement on the vibration table while only simple vibration tests can be conducted, and then whether a probe is good or bad can only be determined through an external LCR (Inductance/Capacitance/Resistance) detection apparatus after the vibration is finished.

It can be seen from the above that in the above detection process, the instrument cannot perform high-voltage emission measurement under vibration, and the performance of the while-drilling nuclear magnetic instrument cannot be effectively tested. Moreover, the test process is time-consuming and the operations are complicated.

SUMMARY

The following is a summary of the subject matters described in detail herein. This summary is not intended to limit the protection scope of the claims.

At least one embodiment of the disclosure provides a vibration detection apparatus applied to a while-drilling nuclear magnetic instrument, which includes a vibration table which is configured to clamp the while-drilling nuclear magnetic instrument horizontally, wherein a scale barrel filled with detection liquid is further mounted in the vibration detection apparatus, and is configured to be suspended over an upper side of the vibration table and is disposed at distance from the while-drilling nuclear magnetic instrument, and during vibration of the vibration table, the scale barrel is kept still and the while-drilling nuclear magnetic instrument performs a high-voltage emission measurement by the scale barrel.

Other aspects will become apparent on reading and understanding the drawings and detailed description.

Reference number: 100 vibration table, 101 clamp, 200 while-drilling nuclear magnetic instrument, 201 probe region, 300 scale barrel, 301 plug, 302 groove, 303 curved surface, 304 inlet port, 305 outlet port, 306 semi-annular cavity, 307 bottom plate, 308 positioning mark, 400 bracket, 401 bracket main body, 402 supporting legs, 403 roller, 404 mounting cavity, 405 reinforcing rib, 406 supporting plates, 407 fixing rib, 500 fixing clip, 501 arc portion, 502 horizontal portion and 600 slides.

DETAILED DESCRIPTION

Hereinafter, embodiments of the present disclosure will be described in detail with reference to the accompanying drawings. It should be noted that the embodiments in the present application and the features in the embodiments may be combined with each other randomly if there is no conflict.

In view of the defects of related vibration detection apparatuses, an embodiment of the present disclosure provides a vibration detection apparatus applied to a while-drilling nuclear magnetic instrument. The apparatus further comprises a scale barrel which is suspended over an upper side of a vibration table and can simultaneously acquire echo signals on the vibration table, thereby ensuring more comprehensive vibration measurement of the instrument and better detection of the actual anti-vibration performance of the instrument.

The vibration detection apparatus applied to a while-drilling nuclear magnetic instrument of the present disclosure will be described below with reference to the embodiments.

Referring to FIGS. 1-7, an embodiment of the present disclosure provides a vibration detection apparatus applied to a while-drilling nuclear magnetic instrument, which comprises a vibration table 100 and a scale barrel 300, wherein the vibration table 100 is configured to clamp the while-drilling nuclear magnetic instrument 200 horizontally, and the scale barrel 300 is filled with detection liquid. A groove 302 for accommodating the while-drilling nuclear magnetic instrument 200 is provided at the bottom of the scale barrel 300. A curved surface 303 corresponding to the upper surface of the while-drilling nuclear magnetic instrument 200 is provided in the groove 302. In addition, the scale barrel 300 is configured to be suspended over an upper side of the vibration table 100 and is disposed at a distance from the while-drilling nuclear magnetic instrument 200 to allow the scale barrel 300 to always maintain a static state during vibration of the vibration table, and the while-drilling nuclear magnetic instrument 200 may transmit high-voltage signals in real time for high-voltage transmission measurement. Therefore, the while-drilling nuclear magnetic instrument 200 can obtain the echo signals of the scale barrel 300 while vibrating, so that its performance is measured more accurately and the test consumes less time.

Figure 1:
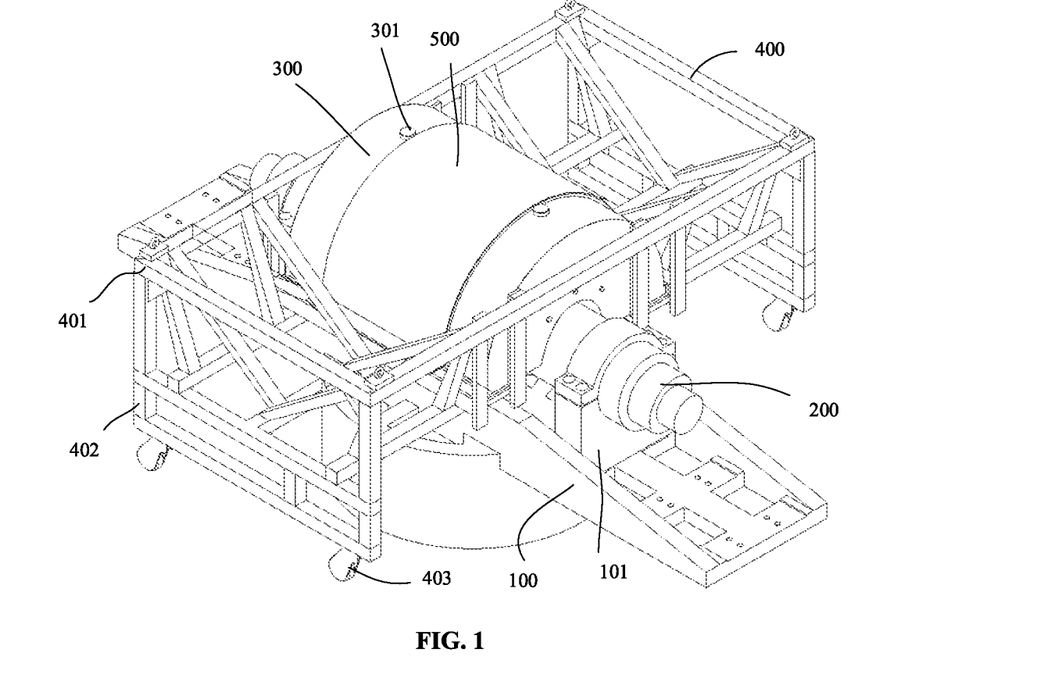
FIG. 1 is a schematic diagram of a vibration detection apparatus according to an embodiment of the present disclosure.
Figure 2:
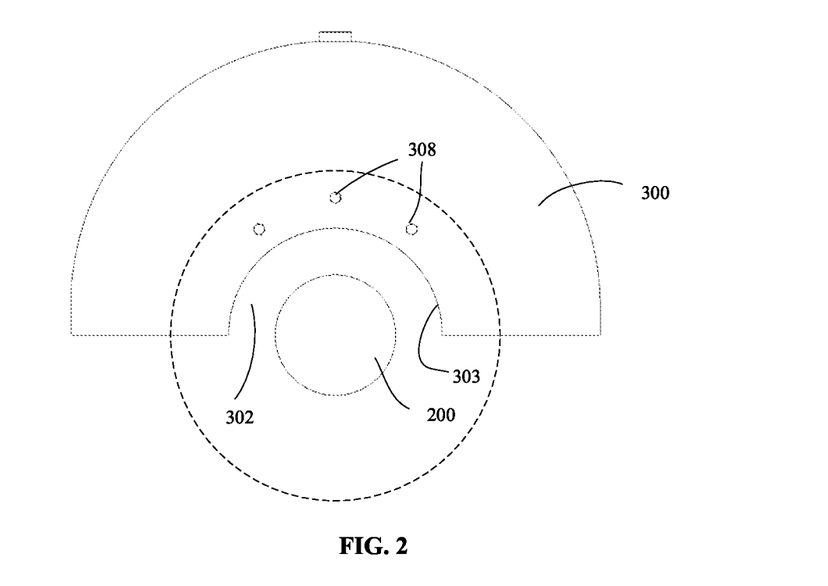
FIG. 2 is a schematic diagram of assembly of a scale barrel and a while-drilling nuclear magnetic instrument in FIG. 1.
Figure 3:
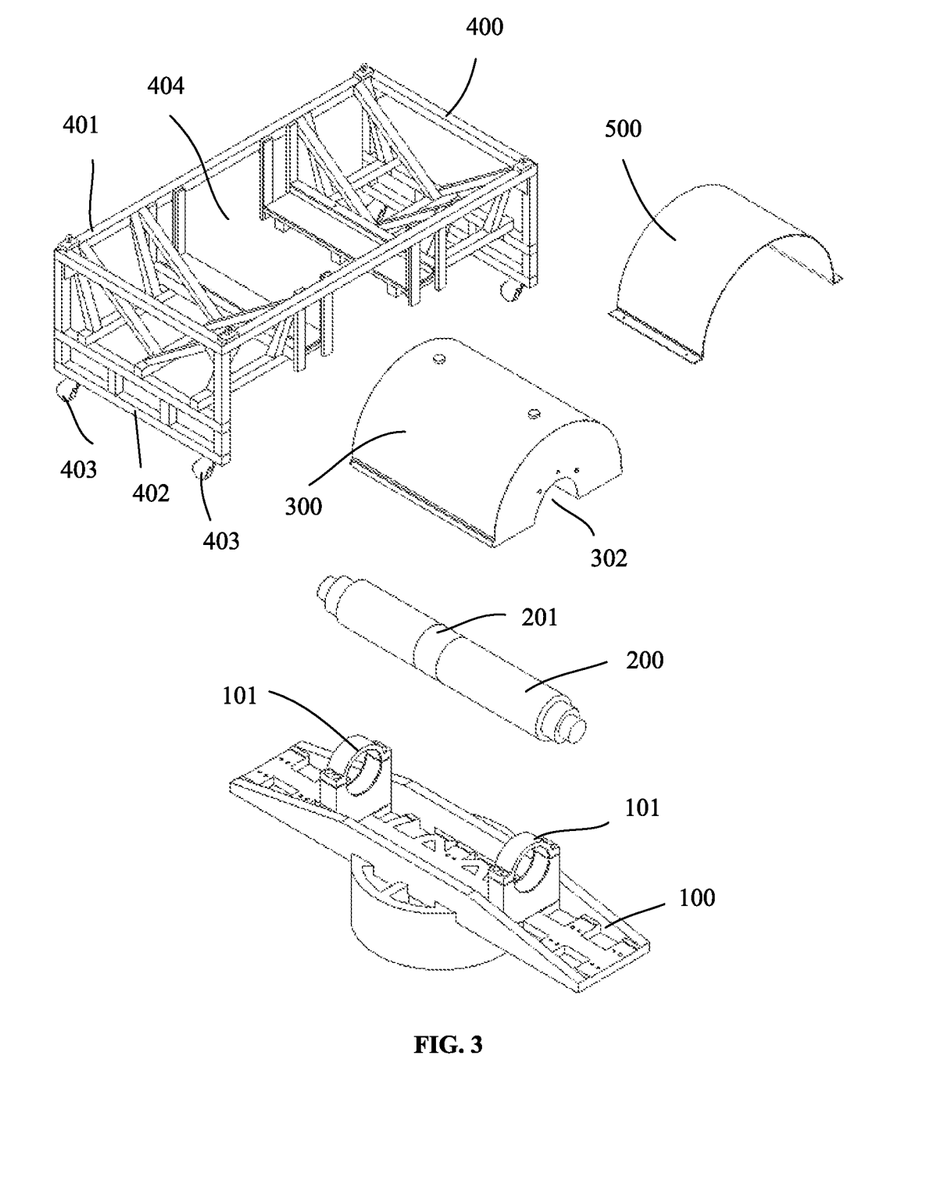
FIG. 3 is an exploded diagram of the vibration detection apparatus in FIG. 1.
Figure 4:
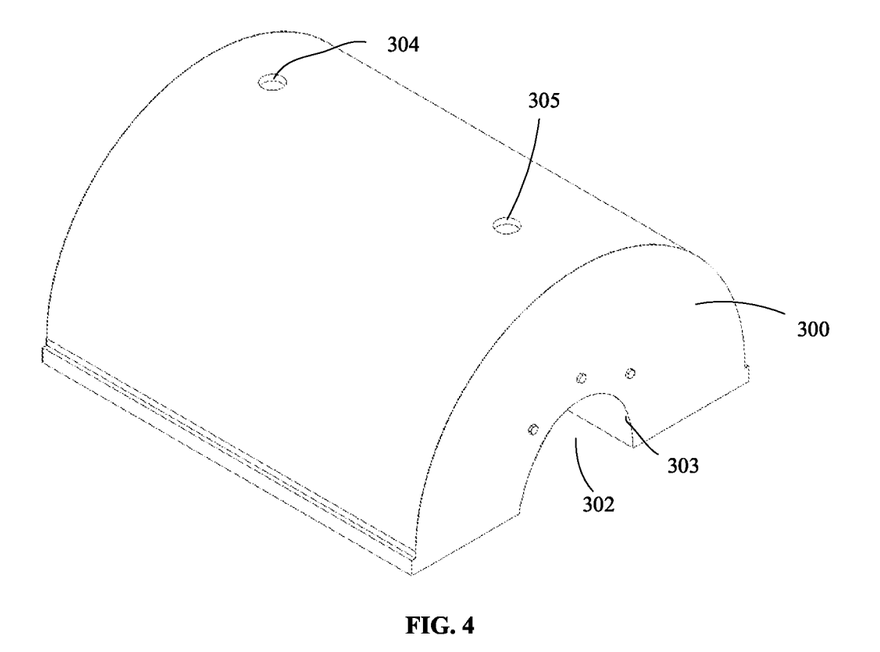
FIG. 4 is a schematic diagram of the scale barrel in FIG. 1.
Figure 5:
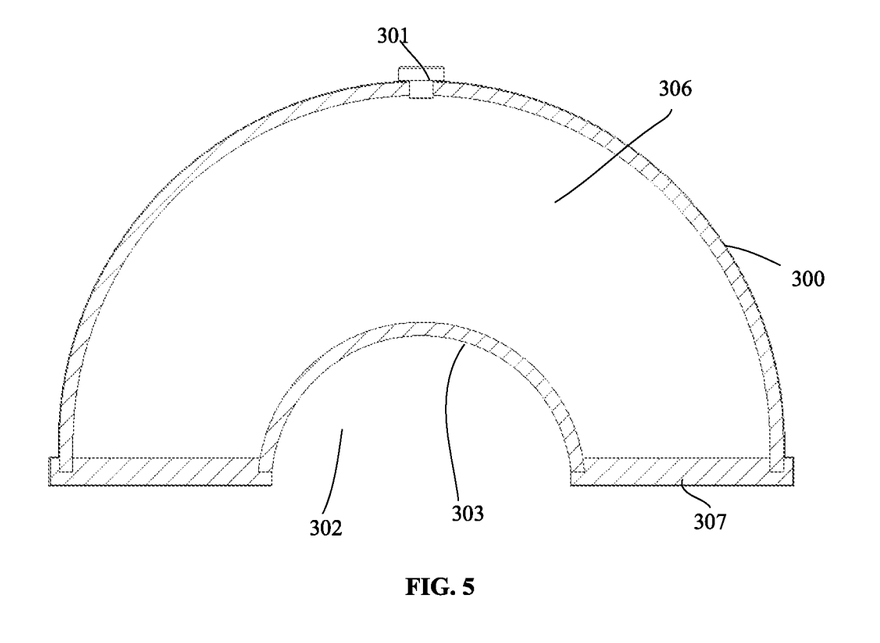
FIG. 5 is a cross-sectional view of the scale barrel in FIG. 1.
Figure 6:
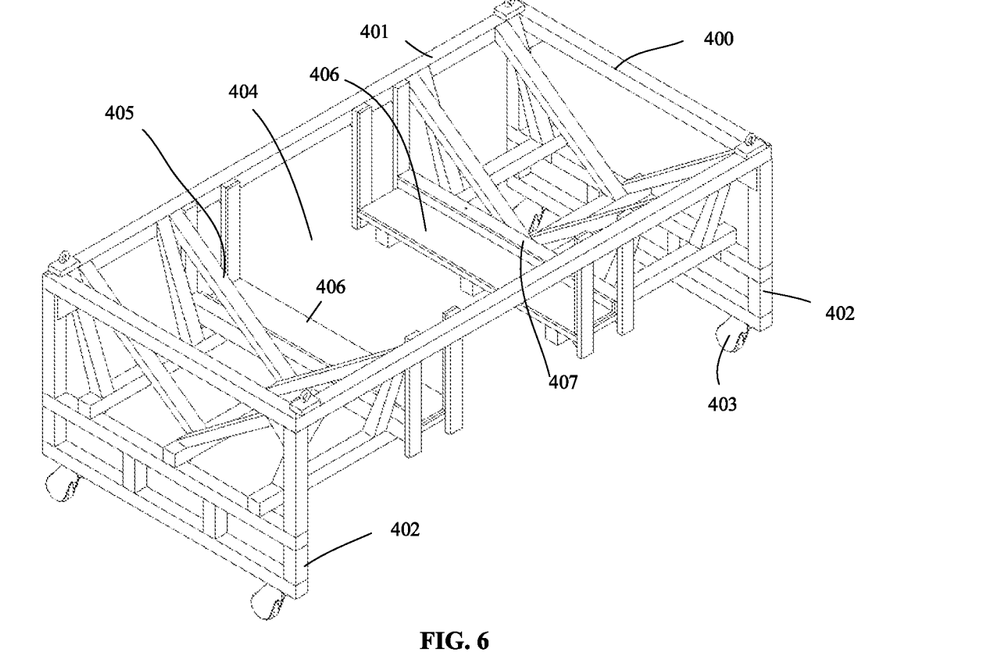
FIG. 6 is a schematic diagram of a bracket in FIG. 1.
Figure 7:
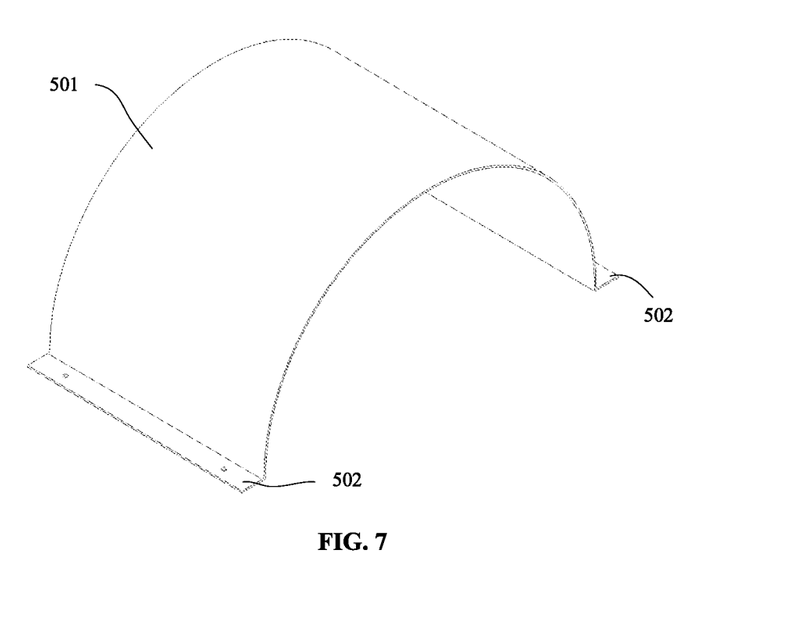
FIG. 7 is a schematic diagram of the fixing clip in FIG. 1.

As shown in FIG. 3, an annular probe region 201 is formed in the middle of the while-drilling nuclear magnetic instrument 200, which is, a region where a probe antenna coil exists, and the probe region 201 has a certain detection sensitive range (as denoted by the dotted line in FIG. 2). The vibration table 100 can drive the while-drilling nuclear magnetic instrument 200 thereon to vibrate. In order to clamp the while-drilling nuclear magnetic instrument 200, as shown in FIGS. 1-3, the top of the vibration table 100 is provided with clamps 101 which are disposed at an interval, wherein the two clamps 101 are detachably mounted on the vibration table 100 by bolts, and a distance between the two clamps 101 can be adjusted according to a length of the while-drilling nuclear magnetic instrument 200. Therefore, the two clamps 101 clamp the two ends of the while-drilling nuclear magnetic instrument 200 respectively so that the instrument is held horizontal.

As shown in FIGS. 2-5, the scale barrel 300 is semi-cylindrical, its top is arc-shaped and its bottom is horizontal, and the bottom surface of the scale barrel is provided with a bottom plate 307 and the groove 302. The bottom plate 307 is disposed to be horizontal, and the groove 302 is disposed to be recessed toward the inner side of the scale barrel 300. A curved surface 303 in the groove 302 makes the groove 302 have a semicircular cross section, and the groove 302 penetrates through the scale barrel 300. Moreover, the groove has a length larger than that of the probe region 201, therefore the scale barrel 300 has a semi-cylindrical shape. Furthermore, the curved surface 303 corresponds to an upper surface of the probe region 201, which means that when the scale barrel 300 is placed on the upper side of the while-drilling nuclear magnetic instrument 200, an axis of the while-drilling nuclear magnetic instrument 200 coincides with an axis of the curved surface 303, which ensures that the distance between the curved surface 303 and the probe region 201 is consistent. In addition, a semi-annular cavity 306 with a semi-annular cross section is formed in the scale barrel 300, and the detection liquid in the semi-annular cavity 306 is copper sulfate solution. The top of the scale barrel 300 is further provided with an inlet port 304 and an outlet port 305 which communicates the inside and outside. The inlet port 304 is disposed at a distance from the outlet port 305. An operator can add the detection liquid through the inlet port 304 and the outflow port 305, while during the detection, the inlet port 304 and the outlet port 305 need to be blocked with plugs. The inlet port 304 and the outlet port 305 may be respectively connected with a detection liquid source and a pump, wherein the pump can provide power for pumping the detection liquid. The pump may pump out initial detection liquid in the scale barrel 300, and, driven by the suction force, pumps fresh detection liquid from the detection liquid source into the scale barrel 300 to realize the cyclic replacement of detection liquid in the scale barrel 300. In order to locate relative positions between the scale barrel 300 and the while-drilling nuclear magnetic instrument 200. As shown in FIG. 2, an end face of the scale barrel 300 is provided with three positioning marks 308, which can be used for centering the scale barrel 300 and the while-drilling nuclear magnetic instrument 200. In addition, the scale barrel 300 is mainly made of glass fiber reinforced plastic (FRP) and is enveloped by a metal shell, and the metal shell may be made of alloy copper or stainless steel etc. to form electromagnetic shielding. The FRP material can effectively avoid the influence on the inductance of the antenna coil in the probe region 201 of the instrument. Because the scale barrel 300 is coated with a metal shell made of a non-magnetic material (alloy copper or stainless steel, etc.), the scale barrel 300 will not affect the change of the static magnetic field of the while-drilling nuclear magnetic instrument, and the metal shell has good conduction property which can effectively shield the influence of spatial electromagnetic interference during the measurement of the instrument.

In order to make the scale barrel 300 suspend over the upper side of the vibration table 100, the vibration detection apparatus further includes a bracket 400 for fixing the scale barrel 300. As shown in FIGS. 1, 3, 6 and 7, two ends of the bracket 400 are supported on the ground. The bracket 400 is not connected with the vibration table 100. The bracket is configured to be disposed perpendicular to a length direction of the vibration table 100 and to span the vibration table 100. The bracket 400 includes a bracket main body 401 and supporting legs 402. The bracket main body 401 is configured to be connected with the supporting legs 402 and the bracket main body 401 is perpendicular to the vibration table 100. The supporting legs 402 are provided at two ends of the bracket main body 401 and extend downward. The bracket main body 401 is a horizontal frame structure formed by joint hollow steel pipes. In the frame structure, a mounting cavity 404 is provided for accommodating the scale barrel 300, and two spaced supporting plates 406 are disposed at the bottom of the mounting cavity 404. The supporting plates 406 are horizontally disposed to support the bottom plate 307 of the scale barrel 300, and the gap between the two supporting plates 406 avoids the groove 302 on the scale barrel 300. In addition, the scale barrel 300 is positioned and fixed on the bracket 400 by a fixing clip 500, wherein the fixing clip comprises horizontal portions 502 and an arc portion 501 which is semicircular. The arc portion 501 is matched with an upper surface of the scale barrel 300 and is fixed to the surface by wielding. The horizontal portions 502 are horizontally disposed on two sides of the arc portion 501, and correspondingly, the mounting cavity 404 is provided with protruding fixing ribs 407 on the side of each supporting plate 406. The horizontal portions 502 are configured to overlap the upper sides of the fixing ribs 407 and be fixed with the fixing ribs by screws. In addition, the bracket main body 401 is provided with multiple reinforcing ribs 405 on two sides of the mounting cavity 404, which can improve the strength and ensure the structural stability. In order to facilitate the movement of the bracket 400, multiple rollers 403 are arranged at the bottom of the supporting legs 402 which are arranged at the lower ends of the bracket 400 to allow an operator to easily push the bracket 400 and to facilitate moving the scale barrel 300 to the upper side the vibration table 100.

When the while-drilling nuclear magnetic instrument 200 needs to perform a vibration test, firstly, the while-drilling nuclear magnetic instrument 200 needs to be fixed on the vibration table 100, and the bracket 400 to which the scale barrel 300 is fixed is pushed to slide by rollers over the while-drilling nuclear magnetic instrument 200 and the vibration table 100 to allow the scale barrel 300 to be suspended over the while-drilling nuclear magnetic instrument 200 and the probe region 201 to be completely hidden in the groove 302 of the scale barrel 300. Meanwhile, as shown by FIG. 2, the region enclosed by the dashed line is the detection sensitive range of the probe region 201 and thus, it can be seen that the curved surface 303 of the scale barrel 300 is within the detection sensitive range, so as to detect the scale fluid signal under vibration. As shown in FIG. 2, the while-drilling nuclear magnetic instrument 200 can transmit high-voltage signals in real time and detect the echo signals of the scale fluid in the scale barrel 300, so as to achieve the purpose of detecting the echo signals in the scale barrel while vibrating. In addition, although this vibration test can only detect the scale fluid information in the region within the semi-cylindrical scale barrel 300 in the upper half of the nuclear magnetic drilling instrument 200, it will not affect the purpose of the while-drilling nuclear magnetic instrument 200 of simultaneously detecting the scale fluid signal under the vibration test.

Therefore, the while-drilling nuclear magnetic instrument 200 can complete the above vibration test on the vibration detection apparatus, and can comprehensively detect various performances of the while-drilling nuclear magnetic instrument 200 under vibration.

Figure 8:
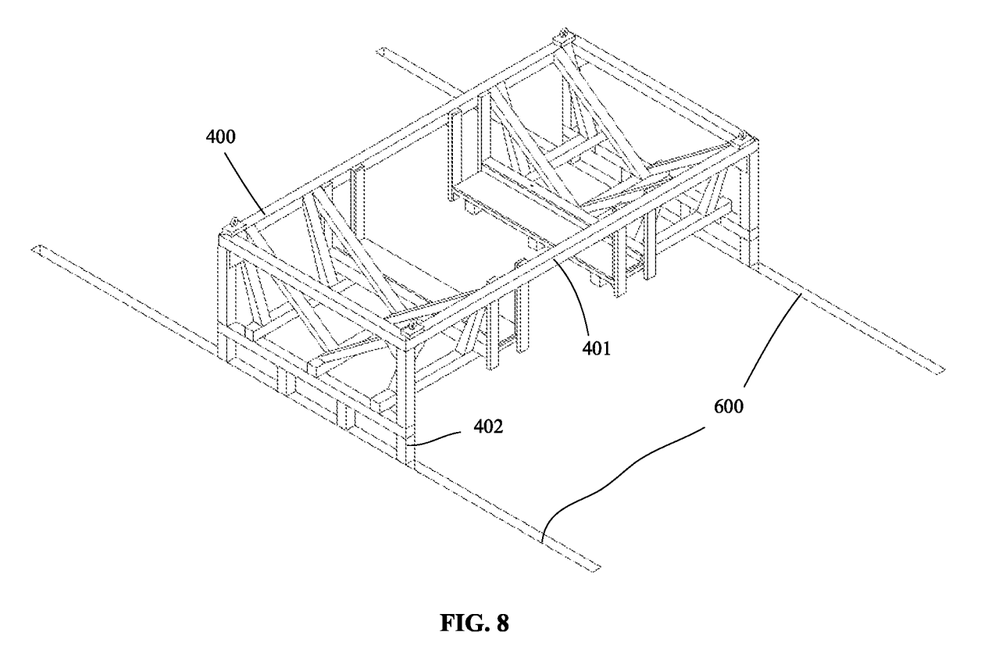
FIG. 8 is a schematic diagram of a bracket of a vibration detection apparatus according to another embodiment of the present disclosure.

In another exemplary embodiment of the present disclosure, as shown in FIG. 8, two parallel slides 600 are arranged on the ground, and the supporting legs 402 at the lower ends of the bracket 400 are not provided with rollers, but are inserted into the slides 600 to form a sliding connection between the bracket 400 and the ground, which can also facilitate the movement of the bracket 400.

The above-mentioned embodiments only express several embodiments of the disclosure. The embodiments are detailed in are more specific and detailed manner, but the descriptions are only the embodiments adopted for easy understanding of the disclosure, and are not intended to limit the disclosure. Without departing from the spirit and scope disclosed herein, any person skilled in the art to which the present application belongs may make any modifications and changes in the form and details of implementation, but the scope of patent protection of the present application shall still be defined by the appended claims.

What is claimed is:

1. A vibration detection apparatus applied to a while-drilling nuclear magnetic instrument, which comprises a vibration table which is configured to clamp the while-drilling nuclear magnetic instrument horizontally, wherein a scale barrel filled with detection liquid is further mounted in the vibration detection apparatus, and is configured to be suspended over an upper side of the vibration table and is disposed at distance from the while-drilling nuclear magnetic instrument, and during vibration of the vibration table, the scale barrel is kept still and the while-drilling nuclear magnetic instrument performs a high-voltage emission measurement by the scale barrel.

2. The vibration detection apparatus applied to a while-drilling nuclear magnetic instrument according to claim 1, wherein the bottom of the scale barrel is provided with a groove for accommodating the while-drilling nuclear magnetic instrument, and a curved surface corresponding to an upper surface of the while-drilling nuclear magnetic instrument is provided in the groove.

3. The vibration detection apparatus applied to a while-drilling nuclear magnetic instrument according to claim 2, further comprising a bracket, wherein the bracket is disposed perpendicular to a length direction of the vibration table and spans the vibration table, and the scale barrel is configured to be fixed on the bracket.

4. The vibration detection apparatus applied to a while-drilling nuclear magnetic instrument according to claim 3, wherein the bottom of the bracket is provided with rollers for moving the bracket.

5. The vibration detection apparatus applied to a while-drilling nuclear magnetic instrument according to claim 4, wherein top of the scale barrel is provided with an inlet port and an outlet port at intervals, and the inlet port and the outlet port are configured to circulate the detection liquid.

6. The vibration detection apparatus applied to a while-drilling nuclear magnetic instrument according to claim 3, wherein the bracket comprises a bracket main body and supporting legs, the bracket main body is connected with the supporting legs, the scale barrel is fixed on the bracket main body by a fixing clip, the supporting legs are disposed at two ends of the bracket main body to support the bracket main body.

7. The vibration detection apparatus applied to a while-drilling nuclear magnetic instrument according to claim 6, wherein the fixing clip is configured to be fixed with the top of the scale barrel by wielding, and two ends of the fixing clip are configured to extend to two sides of the scale barrel and to be fixed with the bracket main body.

8. The vibration detection apparatus applied to a while-drilling nuclear magnetic instrument according to claim 6, wherein the bracket main body is configured to be a horizontal frame structure in which a mounting cavity for accommodating the scale barrel is provided, and the fixing clip is configured to be connected with the mounting cavity.

9. The vibration detection apparatus applied to a while-drilling nuclear magnetic instrument according to claim 8, wherein the bracket main body is provided with reinforcing ribs on both sides of the mounting cavity.

10. The vibration detection apparatus applied to a while-drilling nuclear magnetic instrument according to claim 2, wherein the scale barrel is disposed corresponding to a probe region of the while-drilling nuclear magnetic instrument, and the curved surface is within a detection sensitive range of the probe region.

11. The vibration detection apparatus applied to a while-drilling nuclear magnetic instrument according to claim 3, wherein lower ends of the bracket are supported on the ground, slides are provided on the ground, and the lower ends of the bracket are provided in the slides.

12. The vibration detection apparatus applied to a while-drilling nuclear magnetic instrument according to claim 2, wherein when the scale barrel is placed on the upper side of the while-drilling nuclear magnetic instrument, and an axis of the while-drilling nuclear magnetic instrument coincides with an axis of the curved surface.

13. The vibration detection apparatus applied to a while-drilling nuclear magnetic instrument according to claim 4, wherein the bracket comprises a bracket main body and supporting legs, the bracket main body is connected with the supporting legs, the scale barrel is fixed on the bracket main body by a fixing clip, the supporting legs are disposed at two ends of the bracket main body to support the bracket main body.

14. The vibration detection apparatus applied to a while-drilling nuclear magnetic instrument according to claim 5, wherein the bracket comprises a bracket main body and supporting legs, the bracket main body is connected with the supporting legs, the scale barrel is fixed on the bracket main body by a fixing clip, the supporting legs are disposed at two ends of the bracket main body to support the bracket main body.

15. The vibration detection apparatus applied to a while-drilling nuclear magnetic instrument according to claim 3, wherein the scale barrel is disposed corresponding to a probe region of the while-drilling nuclear magnetic instrument, and the curved surface is within a detection sensitive range of the probe region.

16. The vibration detection apparatus applied to a while-drilling nuclear magnetic instrument according to claim 4, wherein the scale barrel is disposed corresponding to a probe region of the while-drilling nuclear magnetic instrument, and the curved surface is within a detection sensitive range of the probe region.

17. The vibration detection apparatus applied to a while-drilling nuclear magnetic instrument according to claim 5, wherein the scale barrel is disposed corresponding to a probe region of the while-drilling nuclear magnetic instrument, and the curved surface is within a detection sensitive range of the probe region.

* * * * *